(12) United States Patent
Ishikawa et al.

(10) Patent No.: US 12,389,134 B2
(45) Date of Patent: Aug. 12, 2025

(54) FILTER ARRAY INCLUDING OPTICAL FILTERS HAVING DIFFERENT LIGHT TRANSMITTANCES FROM EACH OTHER, PHOTODETECTOR, AND PHOTODETECTION SYSTEM

(71) Applicant: Panasonic Intellectual Property Management Co., Ltd., Osaka (JP)

(72) Inventors: Atsushi Ishikawa, Osaka (JP); Motoki Yako, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 18/393,705

(22) Filed: Dec. 22, 2023

(65) Prior Publication Data

US 2024/0171870 A1    May 23, 2024

Related U.S. Application Data

(63) Continuation of application No. PCT/JP2022/026078, filed on Jun. 29, 2022.

(30) Foreign Application Priority Data

Jul. 12, 2021    (JP) .................................. 2021-115073

(51) Int. Cl.
    *H04N 25/13*     (2023.01)
    *G01J 1/42*      (2006.01)
    (Continued)

(52) U.S. Cl.
    CPC ........... *H04N 25/135* (2023.01); *G02B 5/201* (2013.01); *G02B 5/26* (2013.01); *G02B 5/28* (2013.01);
    (Continued)

(58) Field of Classification Search
    CPC ...... H04N 25/135; H04N 25/47; H04N 23/12; G02B 5/201; G02B 5/288; G02B 5/26;
    (Continued)

(56) References Cited

U.S. PATENT DOCUMENTS

2016/0138975 A1    5/2016   Ando et al.
2016/0148344 A1    5/2016   Koga
                      (Continued)

FOREIGN PATENT DOCUMENTS

JP        2016-100703      5/2016
WO    2020/149056      7/2020

OTHER PUBLICATIONS

International Search Report of PCT application No. PCT/JP2022/026078 dated Aug. 30, 2022.
(Continued)

*Primary Examiner* — Jennifer D Bennett
(74) *Attorney, Agent, or Firm* — Wenderoth, Lind & Ponack, L.L.P.

(57) ABSTRACT

A filter array, which is to be used in a photodetection system that generates image data of each of N wavelength bands (where N is an integer greater than or equal to 4), includes optical filters whose light transmittances in each of the N wavelength bands differ from each other. $(\sigma_1/\mu_1) \geq 0.1, \ldots,$ and $(\sigma_N/\mu_N) \geq 0.1$, where $\mu_i$ is a mean value of transmittances, corresponding one-to-one to the optical filters, with respect to light of an i-th wavelength band (where i is an integer greater than or equal to 1 and less than or equal to N) among
(Continued)

the N wavelength bands, and where $\sigma_i$ is a standard deviation of the transmittances, corresponding one-to-one to the optical filters, with respect to the light of the i-th wavelength band.

12 Claims, 10 Drawing Sheets

(51) Int. Cl.
  *G01J 3/28*    (2006.01)
  *G02B 5/20*    (2006.01)
  *G02B 5/26*    (2006.01)
  *G02B 5/28*    (2006.01)
  *H04N 23/12*   (2023.01)
  *H04N 25/47*   (2023.01)
  *H10F 39/00*   (2025.01)

(52) U.S. Cl.
  CPC ............ *G02B 5/288* (2013.01); *H04N 25/47* (2023.01); *H10F 39/806* (2025.01); *G01J 1/4228* (2013.01); *G01J 2003/2806* (2013.01); *G01J 2003/2826* (2013.01); *H04N 23/12* (2023.01)

(58) Field of Classification Search
  CPC .. G02B 5/28; G01J 1/4228; G01J 2003/2806; G01J 2003/2826; H01L 27/14625; H01L 27/14621
  See application file for complete search history.

(56) References Cited

U.S. PATENT DOCUMENTS

2018/0170093 A1\* 6/2018 Najiminaini ........... B42D 25/29
2021/0318171 A1  10/2021 Inada et al.

OTHER PUBLICATIONS

The EPC Office Action dated Oct. 21, 2024 for the related European Patent Application No. 22841957.8, 11 pages.
Kim Cheolsun et al: "Fabrication of 2D thin-film filter-array for compressive sensing spectroscopy", Optics and Lasers in Engineering, vol. 115, Nov. 24, 2018 (Nov. 24, 2018), pp. 53-58, XP055880705, 6 pages.

\* cited by examiner

FILTER ARRAY INCLUDING OPTICAL FILTERS HAVING DIFFERENT LIGHT TRANSMITTANCES FROM EACH OTHER, PHOTODETECTOR, AND PHOTODETECTION SYSTEM

BACKGROUND

1. Technical Field

The present disclosure relates to a filter array, a photodetector, and a photodetection system.

2. Description of the Related Art

By utilizing spectral information of a large number of (for example, several tens of) bands each of which is a narrow band, it is possible to grasp detailed physical properties of an object that have not been possible to grasp by using existing RGB images. A camera that acquires such multiwavelength information is called a "hyperspectral camera". The hyperspectral camera is used in various fields such as food inspection, living body inspection, drug development, and componential analysis of minerals.

U.S. Patent Application Publication No. 2016/138975 and Japanese Unexamined Patent Application Publication No. 2016-100703 disclose examples of a hyperspectral camera using compressed sensing. For example, U.S. Patent Application Publication No. 2016/138975 discloses an imaging device including a coding element that is an array of optical filters whose wavelength dependencies of light transmittance differ from each other and an image sensor that detects light that has passed through the coding element. The image sensor acquires one wavelength-multiplexed image by simultaneously detecting light of multiple wavelength bands for each pixel. Images about the respective wavelength bands are reconstructed by applying compressed sensing to the acquired wavelength-multiplexed image.

SUMMARY

One non-limiting and exemplary embodiment provides a technology for reducing errors associated with reconstruction of images of multiple wavelength bands.

In one general aspect, the techniques disclosed here feature a filter array to be used in a photodetection system that generates image data of each of N wavelength bands (where N is an integer greater than or equal to 4). The filter array includes optical filters whose light transmittances in each of the N wavelength bands differ from each other. $(\sigma_1/\mu_1) \geq 0.1, \ldots,$ and $(\sigma_N/\mu_N) \geq 0.1$, where $\mu_i$ is a mean value of transmittances, corresponding one-to-one to the optical filters, with respect to light of an i-th wavelength band (where i is an integer greater than or equal to 1 and less than or equal to N) among the N wavelength bands, and where $\sigma_i$ is a standard deviation of the transmittances, corresponding one-to-one to the optical filters, with respect to the light of the i-th wavelength band.

It should be noted that general or specific aspects of the present disclosure may be implemented as a system, an apparatus, a method, an integrated circuit, a computer program, or a computer-readable recording medium, or may be implemented as any combination of a system, an apparatus, a method, an integrated circuit, a computer program, and a recording medium. Examples of a computer-readable recording medium include a non-volatile recording medium such as a compact disc read-only memory (CD-ROM). An apparatus may include one or more apparatuses. When an apparatus includes two or more apparatuses, the two or more apparatuses may be disposed in one unit or may be disposed separately in two or more separate units. In the present specification and the claims, the term "apparatus" may mean not only one apparatus but also a system composed of multiple apparatuses. The apparatuses included in a "system" may include an apparatus that is disposed in a remote area remote from the other apparatuses and connected to the other apparatuses via a communication network.

With an aspect of the present disclosure, it is possible to reduce errors associated with reconstruction of images of multiple wavelength bands.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1A:
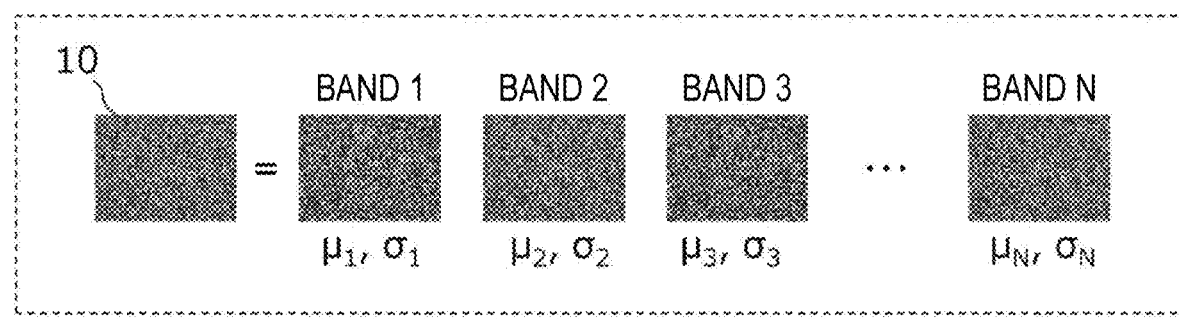
FIG. 1A is a diagram for illustrating the optical characteristics of a filter array.

In the present disclosure, all or a part of a circuit, a unit, an apparatus, a member, or a portion, or all or some of the functional blocks of a block diagram may be implemented in, for example, one or more electronic circuits including a semiconductor device, a semiconductor integrated circuit (IC), or a large-scale integration (LSI). An LSI or an IC may be integrated in one chip, or may be a combination of two or more chips. For example, functional blocks other than a memory device may be integrated in one chip. Devices that are called an LSI or IC here, whose name changes in accordance with the degree of integration, may be called a system LSI, a very large-scale integration (VLSI), or an ultra large-scale integration (ULSI). A field programmable gate array (FPGA), which is an LSI that is programmed after having been manufactured, or a reconfigurable logic device, which is an LSI that allows reconfiguration of internal connection or setting up of internal circuit segments, may be used for the same purpose.

Moreover, all or some of the functions or operations of a circuit, a unit, an apparatus, a member, or a portion may be executed by software processing. In this case, software is stored in one or more non-volatile storage media such as a ROM, an optical disk, and a hard disk drive, and, when the software is executed by a processor, a function specified by the software is executed by the processor and a peripheral device. A system or an apparatus may include one or more non-volatile storage media in which software is stored, a processor, and a necessary hardware device such as an interface.

Hereafter, exemplary embodiments according to the present disclosure will be described. Embodiments described below each give a general or specific example. Numerical values, shapes, elements, the dispositions of the elements, the connections between the elements, steps, and the order of the steps described in the following embodiments are examples, and are not intended to limit the present disclosure. Elements according to the following embodiments that are not described in the independent claims, which show the broadest concepts, are described as optional elements. Each of the figures is a schematic view, and is not necessarily drawn strictly. Moreover, in the figures, substantially the same elements are denoted by the same numerals, and redundant descriptions of such elements may be omitted or simplified.

Before describing the embodiments of the present disclosure, findings made by the inventors will be described.

Regarding a hyperspectral camera using compressed sensing, the optical properties of a coding element, that is, an optical filter array significantly affects the quality of a reconstructed image. In the present specification, an optical filter array will be simply referred to as a "filter array". If the characteristics of the filter array are not appropriate, a reconstructed image has a major error, and therefore it is not possible to obtain a high-quality reconstructed image. Mathematically, the filter array may be an ideal filter array that performs sampling that is random spatially and frequency-wise (that is, wavelength-wise). However, it is not easy to practically produce such an ideally random filter array. Moreover, as described below, because it is required to design the filter array in consideration of the sensitivity characteristics of an image sensor 60, there is a room for improvement in the specific configuration of a filter array that can reduce errors associated with reconstruction of images of multiple wavelength bands.

Hereafter, an overview of embodiments of the present disclosure will be described.

FIG. 1A is a diagram for illustrating the optical characteristics of a filter array 10 according to an embodiment of the present disclosure. The filter array 10 illustrated in FIG. 1A includes optical filters. The optical filters are arranged two-dimensionally. The optical filters include multiple types of optical filters whose light transmission characteristics differ. The optical filters can be formed, for example, by using a microstructure including a multilayer film, an organic material, a diffraction grating structure, or a metal. The filter array 10 is used in a photodetector that generates image data of each of multiple wavelength bands. Let N denote the number of the wavelength bands (where N is an integer greater than or equal to 4). The distribution of the light transmittance of the filter array 10 differs between the wavelength bands. In FIG. 1, the spatial pattern of the light transmittance about each wavelength band is represented as a mosaic pattern.

Figure 1B:
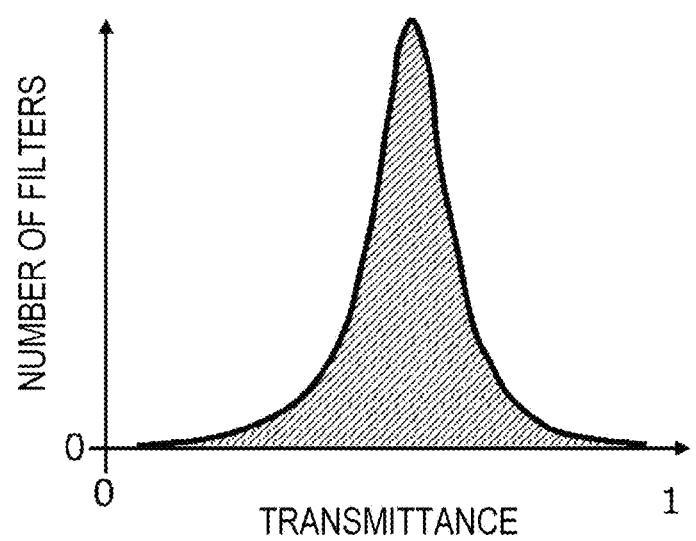
FIG. 1B illustrates an example of a histogram of transmittance.

Here, regarding the i-th wavelength band (where i is an integer greater than or equal to 1 and less than or equal to N), a histogram of the transmittances of the optical filters in the filter array 10 is considered. FIG. 1B illustrates an example of the histogram of the transmittances of the filter array 10 according to the embodiment of the present disclosure. The histogram represents a distribution with the horizontal axis representing transmittance and the vertical axis representing the number of filters having the transmittance. From this histogram, the mean transmittance $\mu_i$ and the standard deviation $\sigma_i$ with respect to light of the i-th wavelength band are obtained. The histogram of the transmittance of the filter array 10 according to the embodiment of the present disclosure has a finite standard deviation $\sigma_i$. It is possible to derive the mean transmittance $\mu_i$ and the standard deviation $\sigma_i$ as follows.

Let $\mu_i$ denote the mean value of the transmittances of the optical filters included in the filter array 10, with respect to light of the i-th wavelength band (where i is an integer greater than or equal to 1 and less than or equal to N) among the N wavelength bands. Assume that the filter array 10 includes M filters (where M is an integer greater than or equal to 4), and let $T_{ij}$ denote the transmittance of the j-th filter (where j is an integer greater than or equal to 1 and less than or equal to M), among the M filters, with respect to light of the i-th wavelength band. Then, the mean value $\mu_i$ of the transmittances is represented by the following equation (1).

$$\mu_i = \frac{1}{M}\sum_{j=1}^{M} T_{ij} \tag{1}$$

Let σμ denote the standard deviation of the mean values $\mu_i$ of transmittances about the N wavelength bands. Then, σμ is represented by the following equation (2).

$$\sigma_\mu = \sqrt{\frac{1}{N}\sum_{i=1}^{N}(\mu_i - \mu_\mu)^2} \left(\text{where } \mu_\mu \frac{1}{N}\sum_{i=1}^{N}\mu_i\right) \quad (2)$$

It is possible to obtain the histogram of the number of filters included in the filter array 10 against the transmittance of light of the i-th wavelength band by measuring the transmittance of each optical filter in the filter array 10 by using a photodetector that detects light intensity with a predetermined number of gradations. For example, it is possible to obtain the histogram by using a photodetector, such as a sensor, that can detect a two-dimensional distribution of light intensity with a predetermined number of gradations, such as 8 bit or 16 bit. To be specific, it is possible to obtain the transmittance of light of the i-th wavelength band through each filter in the filter array 10 from the ratio of the intensity of light of the i-th wavelength band detected in a state in which the filter array 10 is disposed to the intensity of light of the i-th wavelength band detected in a state in which the filter array 10 is not disposed. It is possible to obtain the histogram illustrated in FIG. 1B from data of the transmittance of each filter obtained by using the method described above. If it is difficult to acquire data of the transmittance of each filter, based on a pixel value output from an image sensor that detects light that has passed through the filter array 10, it is possible to obtain a histogram in which the wavelength dependency of the sensitivity of the image sensor is taken into consideration. The histogram, which is acquired based on the pixel value output from the image sensor, reflects the characteristics of the transmittance of the filter. For simplicity, FIG. 1B illustrates a histogram close to a normal distribution. With an actual filter array 10, a histogram having a shape different from FIG. 1B may be acquired. The shape of the histogram differs between wavelength bands, because the wavelength dependency of transmittance differs between filters. Accordingly, the mean value and the standard deviation of the transmittances of the filters also differ between wavelength bands.

A hyperspectral camera using compressed sensing estimates and acquires images of multiple wavelength bands by solving an ill-posed problem, having the optical characteristics of the filter array 10 as parameters, by using a compressed sensing method. As will be described below in detail, the inventors have found that, in a case of a recursive iterative operation used in compressed sensing, the convergence of a solution improves and errors in a reconstructed image decrease as the mean value of the transmittances of the filters of the filter array 10 for each wavelength band becomes more uniform and the standard deviation of the transmittances increases.

That is, the inventors have conceived the following idea: in order to reduce errors associated with reconstruction of images of multiple wavelength bands, it is preferable to design the filter array 10 so that the mean transmittance of the filter array 10 for each wavelength band is uniform and the standard deviation of transmittances is greater than or equal to a certain value. However, because light that has passed through the filter array 10 is detected by an image sensor whose sensitivity has wavelength dependency, with a photodetector including the filter array 10 and the image sensor, the mean value and the standard deviation of pixel values that are output respectively differ from the mean value and the standard deviation of the transmittances of the filter array 10. Accordingly, in practice, it is necessary to design the filter array 10 in consideration of the wavelength dependency of the sensitivity of the image sensor.

Based on the above findings, the inventors have examined configurations of the filter array 10 for solving the problems. According to an embodiment of the present disclosure, the filter array 10 is designed so that, regarding all bands, the quotient of the standard deviation of transmittances divided by the mean transmittance is greater than or equal to a certain value. With such a design, reconstruction errors in an image of each band can be reduced irrespective of the wavelength dependency of the sensitivity of the image sensor. Hereafter, a filter array, a photodetector, and a photodetection system according to embodiments of the present disclosure will be described.

A filter array according to a first item is a filter array to be used in a photodetection system that generates image data of each of N wavelength bands (where N is an integer greater than or equal to 4). The filter array includes optical filters whose light transmittances in each of the N wavelength bands differ from each other. $(\sigma_1/\mu_1) \geq 0.1$, ..., and $(\sigma_N/\mu_N) \geq 0.1$, where $\mu_i$ is a mean value of transmittances, corresponding one-to-one to the optical filters, with respect to light of an i-th wavelength band (where i is an integer greater than or equal to 1 and less than or equal to N) among the N wavelength bands, and where $\sigma_i$ is a standard deviation of the transmittances, corresponding one-to-one to the optical filters, with respect to the light of the i-th wavelength band.

With the filter array, it is possible to reduce errors associated with reconstruction of images of multiple wavelength bands.

A filter array according to a second item is the filter array according to the first item, in which at least one of the optical filters is a Fabry-Pérot filter.

With the filter array, it is possible to realize a condition such that $\sigma_i/\mu_i$ is greater than or equal to 0.1 by using the Fabry-Pérot filter.

A filter array according to a third item is the filter array according to the first or second item, in which at least one of the optical filters includes a first reflection layer, a second reflection layer, and an intermediate layer between the first reflection layer and the second reflection layer, and includes a resonance structure having resonance modes whose orders differ from each other.

With the filter array, it is possible to realize transmission spectra that differ between the filters by changing the refractive index or the thickness of the intermediate layer between the filters.

A filter array according to a fourth item is a photodetector to be used in a photodetection system that generates image data of each of N wavelength bands (where N is an integer greater than or equal to 4). The photodetector includes optical filters whose light transmittances in each of the N wavelength bands differ from each other, and an image sensor that detects light that has passed through the optical filters, The image sensor detects only light corresponding to an i-th wavelength band (where i is an integer greater than or equal to 1 and less than or equal to N) among the N wavelength bands, and thereby outputs data that represents a pixel value distribution corresponding to the i-th wavelength band. $(\sigma_1/\mu_1) \geq 0.1$, ..., and $(\sigma_N/\mu_N) \geq 0.1$, where $\mu_i$ is a mean value of pixel values of the pixel value distribution corresponding the i-th wavelength band, and where $\sigma_i$ is a standard deviation of the pixel values of the pixel value distribution corresponding the i-th wavelength band.

With the photodetector, it is possible to reduce errors associated with reconstruction of images of multiple wavelength bands.

A photodetector according to a fifth item is the photodetector according to the fourth item, in which at least one of the optical filters is a Fabry-Pérot filter.

With the photodetector, it is possible to realize a condition such that $\sigma_i/\mu_i$ is greater than or equal to 0.1 by using the Fabry-Pérot filter.

A photodetector according to a sixth item is the photodetector according to the fourth or fifth item, in which at least one of the optical filters includes a first reflection layer, a second reflection layer, and an intermediate layer between the first reflection layer and the second reflection layer, and includes a resonance structure having resonance modes whose orders differ from each other.

With the filter array, it is possible to realize transmission spectra that differ between the filters by changing the refractive index or the thickness of the intermediate layer between the filters.

A photodetector according to a seventh item is the photodetector according to any one of the fourth to sixth items, in which a transmission spectrum of each of the optical filters has a maximal value of transmittance at each of wavelengths included in a target wavelength range. The image sensor includes photodetection elements. Each of the photodetection elements is disposed at a position that receives transmitted light that has passed through at least one of the optical filters, and detects light having the wavelengths included in the transmitted light.

With the photodetector, it is possible to reconstruct images of multiple wavelength bands by processing a signal that is output from the image sensor that has detected the aforementioned light.

A photodetection system according to an eighth item includes the photodetector according to any one of the fourth to seventh items, and a signal processing circuit that generates the image data about each of the N wavelength bands based on a signal that is output from the image sensor.

With the photodetection system, it is possible to reduce errors associated with reconstruction of images of multiple wavelength bands.

A photodetection system according to a ninth item is the photodetection system according to the eighth item, in which the signal processing circuit generates the image data by performing an operation that uses compressed sensing.

With the photodetection system, it is possible to generate image data about each of the N wavelength bands with high accuracy.

In the present specification, a signal representing an image (that is, a set of signals representing the pixel values of pixels) may be simply referred to as an "image". In the following description, the xyz coordinates shown in the figures will be used.

EMBODIMENTS

Photodetection System

Figure 2A:
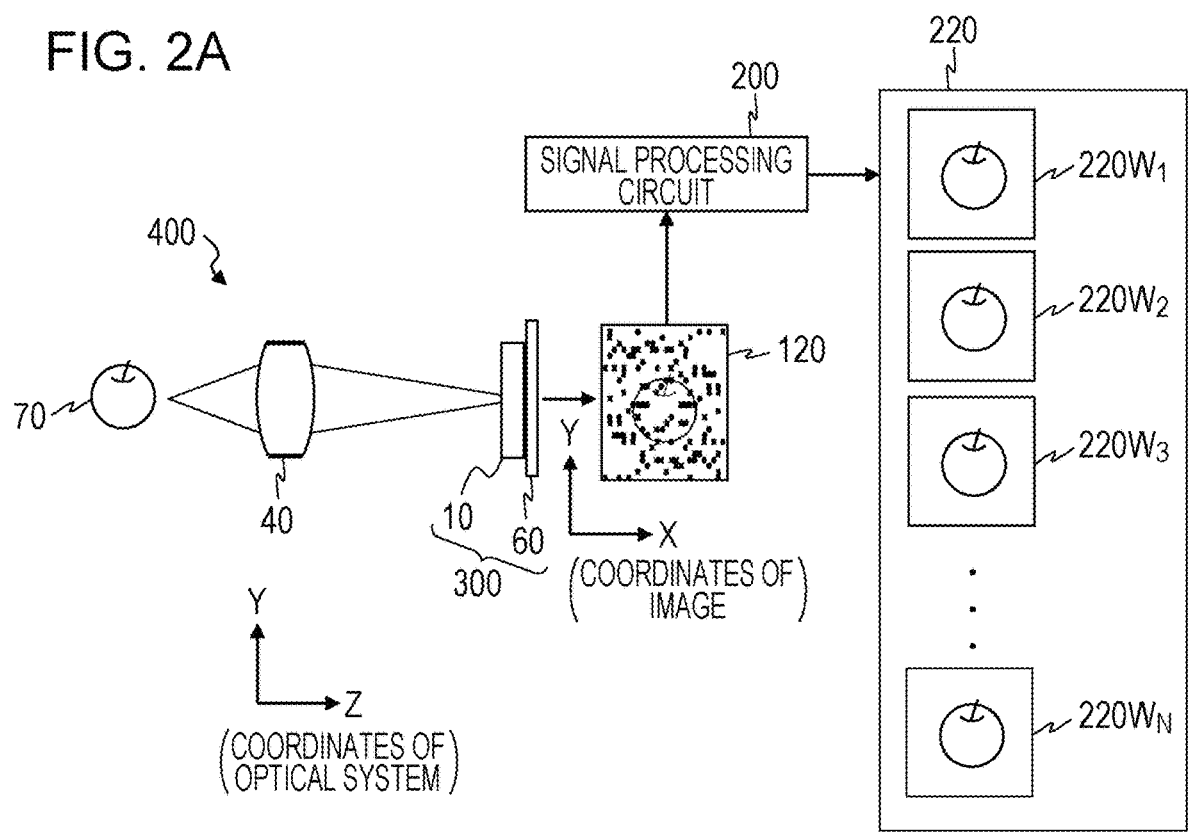
FIG. 2A schematically illustrates a photodetection system according to an exemplary embodiment of the present disclosure.

FIG. 2A schematically illustrates a photodetection system 400 according to an exemplary embodiment of the present disclosure. The photodetection system 400 includes an optical system 40, the filter array 10, the image sensor 60, and a signal processing circuit 200. The filter array 10 has a function similar to that of a "coding element" disclosed in U.S. Patent Application Publication No. 2016/138975. Therefore, the filter array 10 may also be referred to as a "coding element". The optical system 40 and the filter array 10 are disposed on the light path of light incident from an object 70.

The filter array 10 has light-transmissive regions that are arranged in rows and columns. The filter array 10 is an optical element whose transmission spectrum, that is, wavelength dependency of light transmittance differs between regions. The filter array 10 transmits incident light while modulating the intensity of the light. Details of the configuration of the filter array 10 will be described below.

The filter array 10 may be disposed in the vicinity of or directly on the image sensor 60. Here, the phrase "in the vicinity of" means that the filter array 10 is disposed close to the image sensor 60 to such a degree that an image of light from the optical system 40 can be formed on a surface of the filter array 10 with a certain degree of clearness. The phrase "directly on" means that the filter array 10 is disposed close to the image sensor 60 to such a degree that substantially no gap is formed therebetween. The filter array 10 and the image sensor 60 may be integrated. A device including the filter array 10 and the image sensor 60 will be referred to as a "photodetector 300".

Figure 2B:
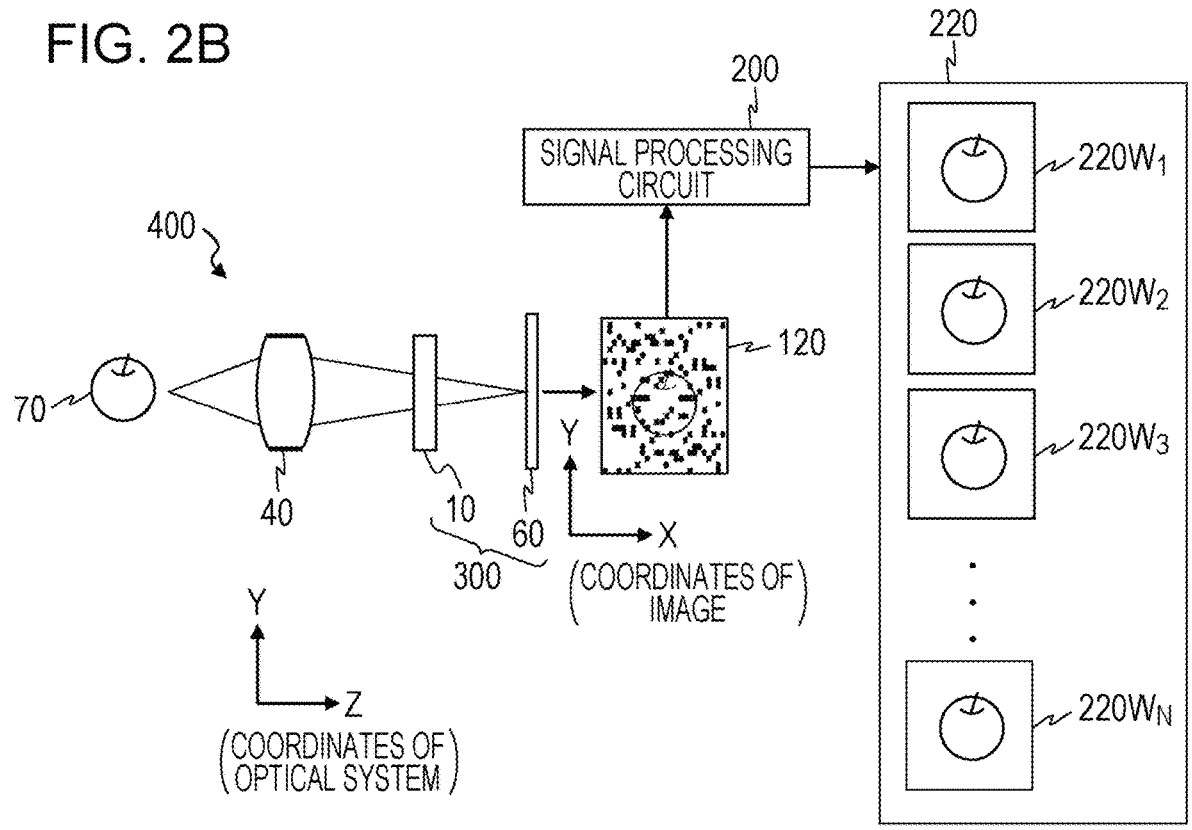
FIG. 2B schematically illustrates a modification of the photodetection system according to the exemplary embodiment of the present disclosure.
Figure 2C:
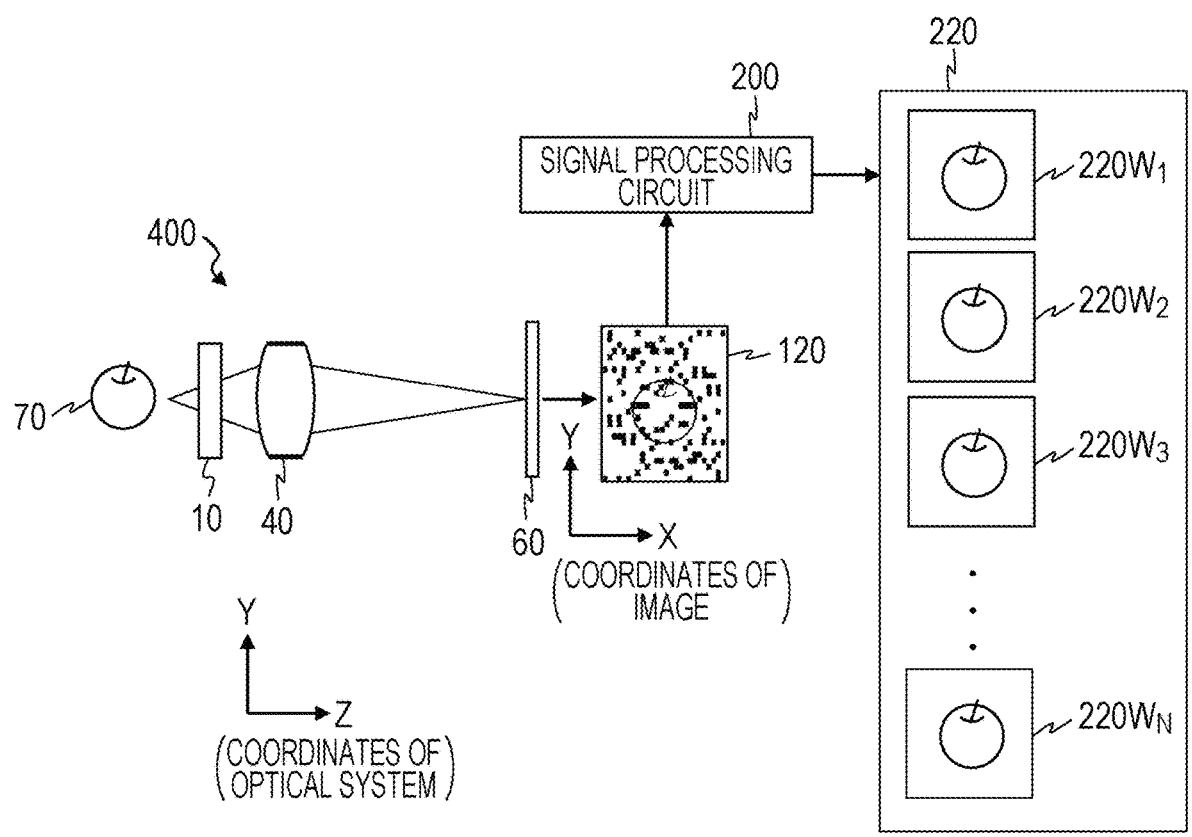
FIG. 2C schematically illustrates another modification of the photodetection system according to the exemplary embodiment of the present disclosure.

The filter array 10 may be disposed separate from the image sensor 60. FIGS. 2B and 2C illustrate examples of a configuration in which the filter array 10 is disposed separate from the image sensor 60. In the example illustrated in FIG. 2B, the filter array 10 is disposed between the optical system 40 and the image sensor 60. In the example illustrated in FIG. 2C, the filter array 10 is disposed between the object 70 and the optical system 40. In these examples, an image coded by the filter array 10 is acquired on an imaging surface of the image sensor 60 in a blurred state. Accordingly, by preparing the blur information beforehand and reflecting the blur information on a system matrix H used in an operational processing described below, it is possible to reconstruct separated images 220. Here, the blur information is represented by a point spread function (PSF). PSF is a function that specifies the degree of spreading of a point image to surrounding pixels. For example, when a point image corresponding one pixel of an image is blurred to be spread over a region of k×k pixels around the pixel, the PSF can be specified as a group of coefficients each representing an effect on a corresponding one of the pixels in the region, that is, a matrix. By reflecting the effect of blur of a coding pattern specified by the PSF on the system matrix H described below, it is possible to reconstruct the separated images 220. Although the filter array 10 may be disposed at any appropriate position, a position such that the coding pattern of the filter array 10 does not excessively spread and vanish may be selected.

The optical system 40 includes at least one lens. Although the optical system 40 is illustrated as one lens in FIG. 1, the optical system 40 may be a combination of lenses. The optical system 40 forms an image on the imaging surface of the image sensor 60 via the filter array 10.

The image sensor 60 is a monochrome photodetector having photodetection elements (in the present specification, also referred to as "pixels") that are arranged two-dimensionally. The image sensor 60 may be, for example a charge-coupled device (CCD), a complementary metal oxide semiconductor (CMOS) sensor, an infrared array sensor, a terahertz array sensor, or a millimeter-wave array sensor. The photodetection element includes, for example, a photodiode. The image sensor 60 need not be a monochrome sensor. For example, the image sensor 60 may be a color sensor. A color sensor include: a sensor having a red-light transmitting filter, a green-light transmitting filter, and a blue-light transmitting filter; a sensor having a red-light transmitting filter, a green-light transmitting filter, a blue-light transmitting filter, and an infrared-ray transmitting filter; or a sensor having a red-light transmitting filter, a green-light transmitting filter, a blue-light transmitting filter, and a white-light transmitting filter. By using a color sensor, it is possible to increase the amount of information regarding wavelength and to improve the accuracy of reconstruction of the separated images 220. However, because the amount of information regarding spatial directions (x and y directions) decreases when a color sensor is used, there is a trade-off between resolution and the amount of information regarding wavelength. A wavelength range to be acquired may be determined in any appropriate manner, is not limited to a visible wavelength range, and may be a wavelength range of ultraviolet rays, near infrared rays, mid-infrared rays, far-infrared rays, microwaves, or radio waves.

The signal processing circuit 200 reconstructs the separated images 220 including multiwavelength information based on an image 120 acquired by the image sensor 60. Details of the separated images 220 and a method of processing an image signal by the signal processing circuit 200 will be described below. The signal processing circuit 200 may be incorporated in the photodetector 300 or may be an element of a signal processor electrically connected to the photodetector 300 by wire or wirelessly.

Hereafter, the filter array 10 according to the present embodiment will be described. The filter array 10 is disposed on the optical path of light incident from the object 70, modulates the intensity of the incident light for each wavelength, and outputs the light. This process performed by the filter array will be referred to as "coding" in the present specification.

Figure 3A:
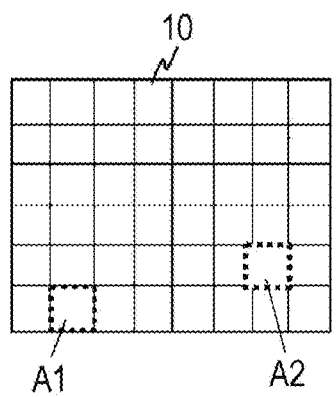
FIG. 3A schematically illustrates an example of the filter array.

FIG. 3A schematically illustrates an example of the filter array 10. The filter array 10 has regions that are arranged two-dimensionally. In the present specification, each of the regions may be referred to as a "cell". In each region, an optical filter having a transmission spectrum that is individually set is disposed. The transmission spectrum is represented by a function $T(\lambda)$, where $\lambda$ is the wavelength of incident light. The transmission spectrum $T(\lambda)$ can have values that are greater than or equal to 0 and less than or equal to 1.

In the example illustrated in FIG. 3A, the filter array 10 has 48 rectangular regions that are arranged in 6 rows and 8 columns. This is only an example, and, in practical use, a larger number of regions may be provided. The number of regions may be, for example, approximately the same as the pixel number of a general photodetector such as an image sensor. The pixel number may be, for example, from several hundreds of thousands to several tens of millions. In the example illustrated in FIG. 2A, the filter array 10 is disposed directly on the image sensor 60, and each region is disposed to correspond to one of the pixels of the photodetector. Each region faces, for example, a corresponding one of the pixels of the image sensor 60.

Figure 3B:
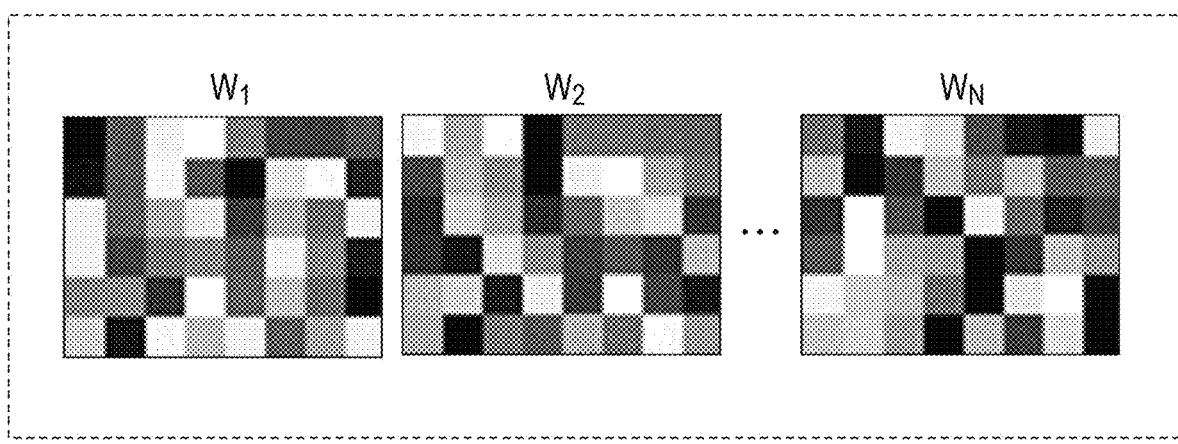
FIG. 3B illustrates an example of the spatial distribution of the light transmittance of the filter array.

FIG. 3B illustrates an example of the spatial distribution of the transmittance of light of each of a wavelength band $W_1$, a wavelength band $W_2$, . . . , a wavelength band $W_N$. In the example illustrated in FIG. 3B, the difference in shade between regions represents the difference in transmittance. A lighter shaded region has a higher transmittance, and a darker shaded region has a lower transmittance. As illustrated in FIG. 3B, the spatial distribution of light transmittance differs between wavelength bands.

Figure 3C:
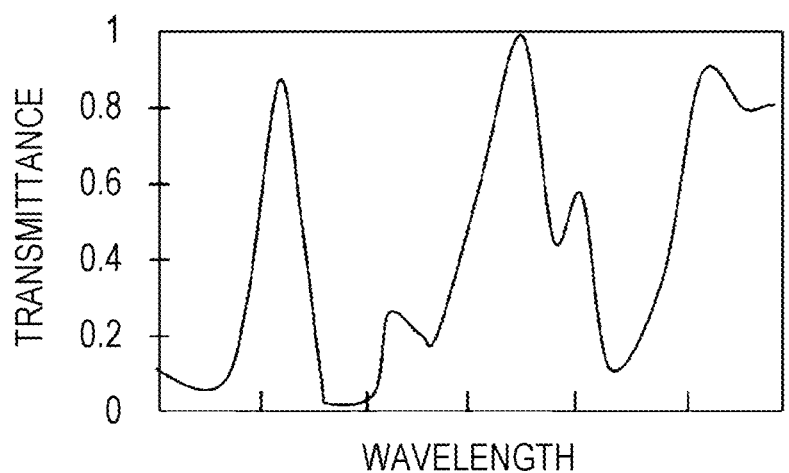
FIG. 3C illustrates an example of the transmission spectrum of the filter array.
Figure 3D:
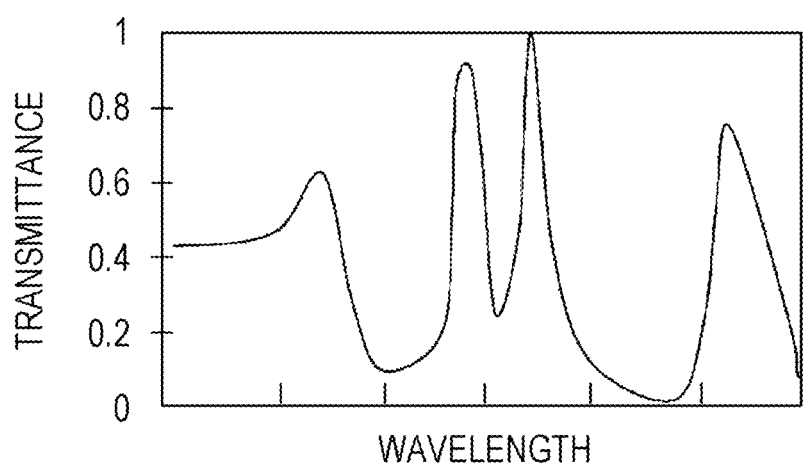
FIG. 3D illustrates another example of the transmission spectrum of the filter array.

FIGS. 3C and 3D respectively illustrate examples of the transmission spectra of a region A1 and a region A2 included in the regions of the filter array 10 illustrated in FIG. 3A. The transmission spectrum of the region A1 and the transmission spectrum of the region A2 differ from each other. In this way, the transmission spectrum of the filter array 10 differ between regions. However, it is not necessary that the transmission spectra of all regions differ. In the filter array 10, the transmission spectra of at least some of the regions differ from each other. The filter array 10 includes two or more filters whose transmission spectra differ from each other. In an example, the number of patterns of the transmission spectra of the regions included in the filter array 10 may be greater than or equal to the number N of wavelength bands included in a target wavelength region. The filter array 10 may be designed so that the transmission spectra of half or more of the regions differ. As illustrated in FIGS. 3C and 3D, each filter may be designed so that the filter transmits light having wavelengths corresponding to peaks in a target wavelength range.

Figure 4A:
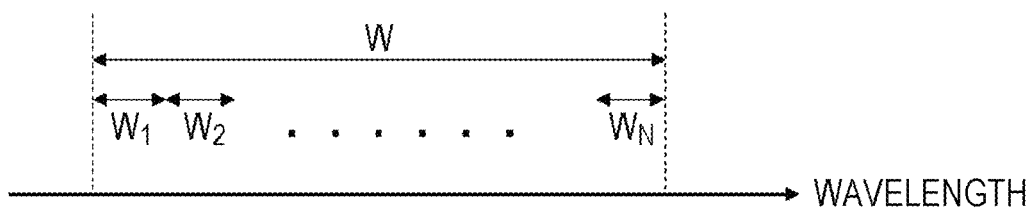
FIG. 4A is a diagram for illustrating the relationship between a target wavelength region W and wavelength bands $W_1, W_2, \ldots, W_N$ included in the target wavelength region W.
Figure 4B:
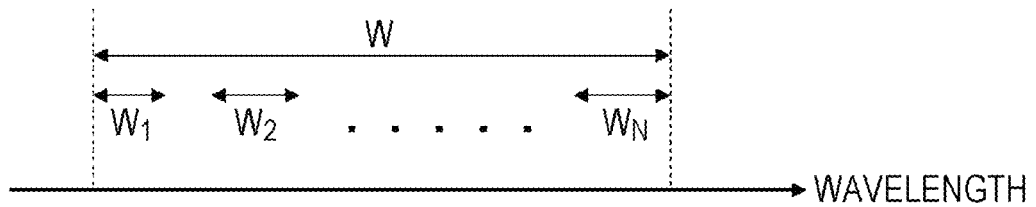
FIG. 4B is a diagram for illustrating the relationship between a target wavelength region W and wavelength bands $W_1, W_2, \ldots, W_N$ included in the target wavelength region W.

FIGS. 4A and 4B are diagrams for illustrating the relationship between the target wavelength region W and the wavelength bands $W_1, W_2, \ldots, W_N$ included in the target wavelength region W. The target wavelength region W may be set to various ranges depending on use. The target wavelength region W may be, for example: a visible wavelength region from about 400 nm to about 700 nm; a near-infrared wavelength region from about 700 nm to about 2500 nm; a near-ultraviolet wavelength region from about 10 nm to about 400 nm; another wavelength region such as a mid-infrared wavelength region, a far-infrared wavelength region, or a terahertz wavelength region; or a radio-wave region such as a millimeter wavelength region. In this way, a wavelength region to be used is not limited to a visible wavelength region. In the present specification, in addition to visible light, electromagnetic radiation that is not visible light, such as near-ultraviolet rays, near-infrared rays, or a radio wave, is also referred to as "light" for convenience.

In the example illustrated in FIG. 4A, the bands $W_1, W_2, \ldots, W_N$ are wavelength regions each of which is 1/N of the target wavelength region W, where N is any integer greater than or equal to 4. However, this is not a limitation. The wavelength bands included in the target wavelength region W may be set in any appropriate manner. For example, the bandwidth may differ between wavelength bands. There may be a gap or an overlap between adjacent bands. In the example illustrated in FIG. 4B, the bandwidth differs between the wavelength bands, and there is a gap between each adjacent pair of the wavelength bands. In this way, the wavelength bands may be set in any manner, as long as they differ from each other. The number N of division of wavelength may be less than or equal to 3.

Figure 5A:
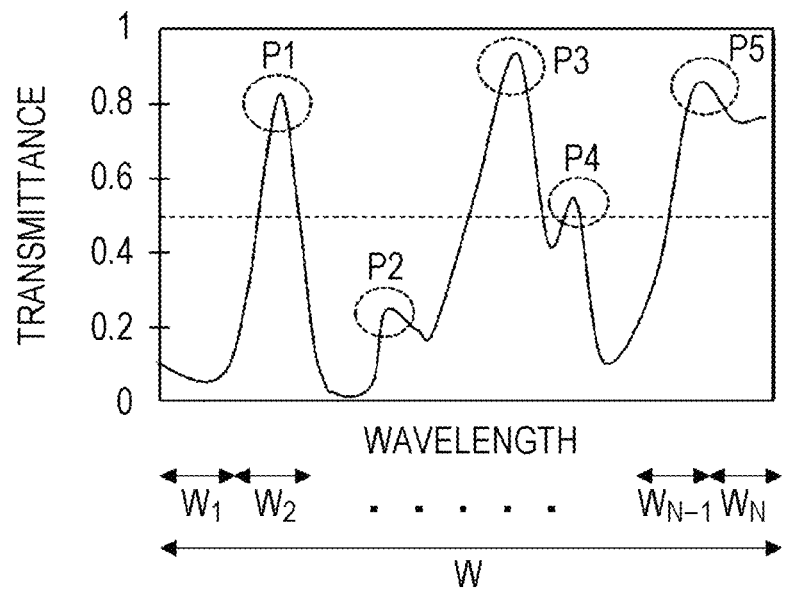
FIG. 5A is a graph for illustrating the characteristics of a transmission spectrum in a certain region of the filter array.

FIG. 5A is a graph for illustrating the characteristics of a transmission spectrum in a certain region of the filter array 10. In the example illustrated in FIG. 5A, the transmission spectrum has maximal values (that is, a maximal value P1, . . . , a maximal value P5) and minimal values with respect to wavelengths in the target wavelength region W. In the example illustrated in FIG. 5A, the transmission spectrum is normalized so that the maximum value and the minimum value of the light transmittance in the target wavelength region W are respectively 1 and 0. In the example illustrated in FIG. 5A, the transmission spectrum has maximal values in wavelength regions such as the wavelength band $W_2$ and wavelength band $W_{N-1}$. In this way, in the present embodiment, the transmission spectrum of each region has maximal values in at least two wavelength bands among the wavelength bands $W_1$ to $W_N$. As a result, the transmission spectrum of each region has a maximal value of transmittance at each of wavelengths included in the target wavelength region W. As can be seen from FIG. 5A, the maximal value P1, the maximal value P3, the maximal value P4, and the maximal value P5 are greater than or equal to 0.5.

As described above, the light transmittance of each region differs between wavelengths. Accordingly, the filter array 10 transmits a component of incident light in a certain wavelength region and does not transmit much of a component of incident light in the other wavelength regions. For example, the transmittance of the filter array 10 may be greater than 0.5 with respect to light of k wavelength bands among the N wavelength bands, and the transmittance may be less than 0.5 with respect to light in the remaining N-k wavelength bands. Here, k is an integer that satisfies $2 \leq k < N$. If incident light is white light including all wavelength components of visible light evenly, the filter array 10 modulates, for each region, the incident light into light having intensity peaks that are discrete with respect to wavelength, and outputs the multiwavelength light in an overlapping manner.

Figure 5B:
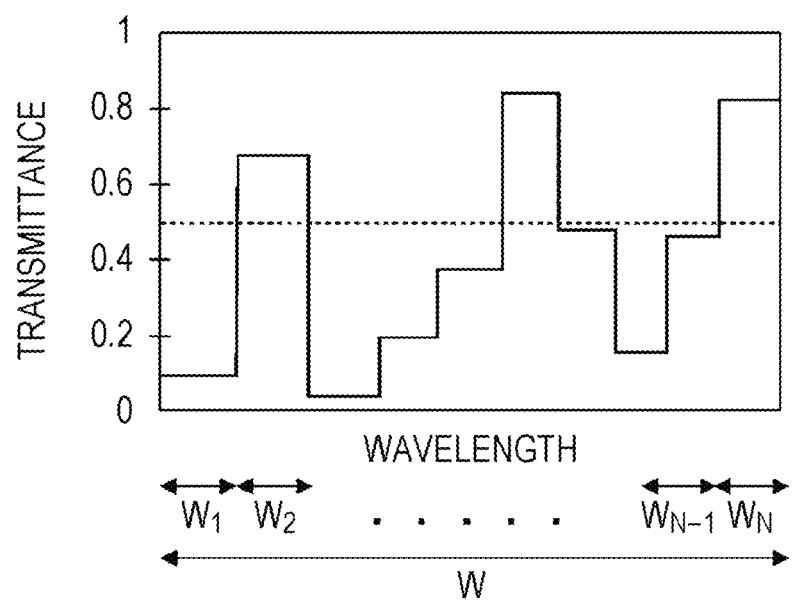
FIG. 5B illustrates the result of averaging the transmission spectrum illustrated in FIG. 5A in each of the wavelength regions $W_1, W_2, \ldots, W_N$.

FIG. 5B is a graph illustrating, as an example, the result of averaging the transmission spectrum illustrated in FIG. 5A for each of the wavelength regions $W_1, W_2, \ldots, W_N$. The averaged transmittance can be obtained by calculating the integral of the spectrum $T(\lambda)$ for each wavelength band and dividing the integral by the bandwidth of the wavelength band. In the present specification, the averaged transmittance for each wavelength band is defined as the transmittance in the wavelength band. In this example, the transmittance is considerably high in three wavelength regions in which the transmission spectrum has the maximal value P1, the maximal value P3, and the maximal value P5. In particular, the transmittance exceeds 0.8 in two wavelength regions in which the transmission spectrum has the maximal value P3 and the maximal value P5.

When the filter array 10 is disposed in the vicinity of or directly on the photodetector, the cell pitch of the filter array 10, which is the distance between regions in the filter array 10, may be substantially coincide with the pixel pitch of the photodetector. In this case, the resolution of an image of coded light emitted from the filter array 10 substantially coincides with the resolution of a pixel. By causing light that has passed through each cell to be incident on only one pixel, it is possible to simplify the operation described below. When the filter array 10 is disposed separate from the photodetector, the cell pitch may be reduced in accordance with the distance between the filter array 10 and the photodetector.

In the examples illustrated in FIGS. 3A to 3D, it is assumed that the transmittance distribution is a gray-scale transmittance distribution such that the transmittance of each region can have any value that is greater than or equal to 0 and less than or equal to 1. However, the transmittance distribution need not be a gray-scale transmittance distribution. For example, the transmittance distribution may be a binary-scale transmittance distribution such that the transmittance of each region can have a value that is either substantially 0 or substantially 1. In the binary-scale transmittance distribution, each region transmits most of light in at least two wavelength regions among the wavelength regions included in a target wavelength range and does not transmit most of light in the remaining wavelength regions. Here, the phrase "most of" means greater than or equal to approximately 80%.

Some of the cells, for example, a half of the cells may be replaced with transparent regions. Such transparent regions transmit light of all of the wavelength regions $W_1$ to $W_N$ included in the target wavelength range with high transmittance of about the same level, such as a transmittance greater than or equal to 80%. With such a configuration, the transparent regions may be disposed, for example, in a checkered pattern. That is, in two arrangement directions of regions in the filter array 10, regions whose light transmittance differ between wavelengths and the transparent regions may be arranged alternately.

Example of Signal Processing

Next, an example of processing performed by the signal processing circuit 200 will be described. The signal processing circuit 200 reconstructs the multiwavelength separated images 220 based on the image 120 output from the image sensor 60 and the spatial distribution characteristics of the transmittance of the filter array 10 for each wavelength. Here, the term "multiwavelength" means a larger number of wavelength regions than, for example, the three-color wavelength regions of RGB acquired by an ordinary color camera. The number of the wavelength regions may be, for example, a number from 4 to about 100. The number of the wavelength regions will be referred to as the "band number". Depending on use, the band number may exceed 100.

Data to be obtained is the separated images 220, and the data is denoted by f. When the number of the spectral bands is denoted by N, f is data including image data $f_1$ corresponding to the wavelength band $W_1$, image data $f_2$ corresponding to the wavelength band $W_2, \ldots$, image data $f_N$ corresponding to the wavelength band $W_N$. When the pixel number of image data in the x direction is denoted by n and the pixel number in the y direction is denoted by m, each of the image data $f_1$, the image data $f_2, \ldots$, and the image data $f_N$ is two-dimensional data of n×m pixels. Accordingly, the data f is a three-dimensional data whose number of elements is n×m×N. On the other hand, the number of elements of data g of the image 120 obtained by being coded and multiplexed by the filter array 10 is n×m. The data g of the image 120 in the present embodiment can be represented by the following equation (3).

$$g = Hf = H \begin{bmatrix} f_1 \\ f_2 \\ \vdots \\ f_N \end{bmatrix} \quad (3)$$

Here, each of $f_1, f_2, \ldots, f_N$ is data having n×m elements. Accordingly, the vector on the right-hand side is a one-dimensional vector of n×m×N rows and 1 column. The data g of the image 120 in equation (3) is a one-dimensional vector of n×m rows and 1 column. The matrix H represents a transformation that codes and intensity-modulates each of the element $f_1, f_2, \ldots, f_N$ of the vector f by using coding information that differ between wavelength bands and that adds the coded and intensity-modulated elements. Accordingly, H is a matrix of n×m rows and n×m×N columns. In the present specification, the matrix H may be referred to as a "system matrix". The action of the system matrix H in equation (3) corresponds to acquiring an image that has been coded and intensity-modulated through the filter array 10 by using the image sensor 60. The elements of the matrix H are determined in accordance with the transmittance of each optical filter in the filter array 10 and the wavelength dependency of the sensitivity of the image sensor 60.

Given the vector g and the matrix H, it seems possible to compute f by solving the inverse problem of the equation (3). However, since the number of elements n×m×N of the data f to be obtained is larger than the number of elements n×m of the acquired data g, this problem is an ill-posed problem, and cannot be solved as it is. Therefore, the signal processing circuit 200 of the present embodiment utilizes redundancy of images included in the data f, and obtains a solution by using a compressed sensing method. To be specific, the data f to be obtained is estimated by solving the following equation (4).

$$f' = \underset{f}{\operatorname{argmin}}\{\|g - Hf\|_{l_2} + \tau\Phi(f)\} \quad (4)$$

Here, f' represents data of the estimated f. In the above equation, the first term in the braces represents the deviation between the estimation result Hf and the acquired data g, which is a so-called residual term. Although the sum of squares is used as the residual term here, the absolute value, the root of the sum of squares, or the like may be used as the residual term. The second term in the braces is a regularization term or a stabilization term described below. The equation (4) means obtaining f that minimizes the sum of the first term and the second term. The signal processing circuit 200 can cause a solution to converge by performing a recursive iterative operation, and thus can compute the final solution f'.

The first term in the braces of the equation (4) means an operation that obtains the sum of squares of the difference between the acquired data g and Hf that is obtained by system-transforming f in the estimation process by using the matrix H. $\Phi(f)$ of the second term is a constraint condition in regularization of f, and is a function that reflects sparse information of estimated data. The second term has an effect of smoothing or stabilizing the estimated data. The regularization term may be represented by, for example, the discrete cosine transform (DCT), the wavelet transform, the Fourier transform, the total variation (TV), or the like of f. For example, when the total variation is used, stable estimated data in which the effect of noise in the observation data g is suppressed can be acquired. The sparseness of the object 70 in the space of each regularization term differs in accordance with the texture of the object 70. A regularization term such that the texture of the object 70 becomes sparser in the space of the regularization term may be selected. Alternatively, multiple regularization terms may be included in the operation. T is a weighting factor. As the weighting factor T increases, the reduction amount of redundant data increases, and the compression rate increases. As the weighting factor T decreases, convergence to a solution weakens. The weighting factor T is set to an appropriate value with which f converges to a certain degree and is not overcompressed.

The following term, which is included in equation (3) and equation (4), g may be denoted by g in descriptions related to equation (3) and equation (4).

Here, the result of study carried out by the inventors about the effect of the optical properties of the filter array 10 on the convergence of the solution of equation (4) will be described qualitatively. First, the standard deviation of the transmittances of the filters for each wavelength band correspond to the randomness in coding for each wavelength band. Accordingly, it is considered that, by increasing the standard deviation, it is possible to increase the coding performance and to improve the convergence of the solution. Next, if the mean value of the transmittances of the filters is not uniform for each wavelength band, due to the action of transformation by the system matrix H, the data f of the estimation process does not become uniform for each wavelength band. As a result, the effect of the regularization term of equation (4) on smoothing or stabilization of the estimation data differs between the wavelength bands, and thus the convergence of the solution may decrease. From another viewpoint, it is considered that, by uniformizing the mean value of the transmittances of the filters for each wavelength band, it is possible to improve the convergence of the solution.

In summary of the above, the inventors have found that, in order to reduce errors associated with reconstruction of images of multiple wavelength bands, it is desirable to design the filter array 10 so that the mean transmittances for each wavelength band to be uniform and the standard deviation of the transmittances to be greater than or equal to a certain value.

Although an example of operation that uses compressed sensing represented by equation (4) has been described here, the solution may be obtained by using another method. For example, other statistical methods such as a maximum likelihood estimation method and a Bayesian estimation method can be used. The number of the separated images 220 may be any appropriate number, and each wavelength band may be set in any appropriate manner. Details of the reconstruction method are disclosed in U.S. Patent Application Publication No. 2016/138975. The entirety of the disclosure in U.S. Patent Application Publication No. 2016/138975 is incorporated in the present specification.

Detailed Configuration of Filter Array

Next, a specific configuration example of the filter array 10 for reducing errors in a reconstructed image will be described.

In the following description, it is assumed that each filter in the filter array 10 is a Fabry-Pérot (FP) filter. The FP filter includes a first reflection layer, a second reflection layer, and an intermediate layer between the first reflection layer and the second reflection layer. Each of the reflection layers may be formed from either of a dielectric multilayer film or a metal thin film. The intermediate layer has a thickness and a refractive index such that a resonance structure having at least one resonance mode is formed. A resonance structure refers to a structure in which light having a certain wavelength can exist stably while forming a standing wave. This state of light will be referred to as a "resonance mode". The transmittance of light having a wavelength corresponding to the resonance mode is high, and the transmittance of light having other wavelengths is low. It is possible to realize transmission spectra that differ between the filters by changing the refractive index or the thickness of the intermediate layer between the filters.

Figure 6:
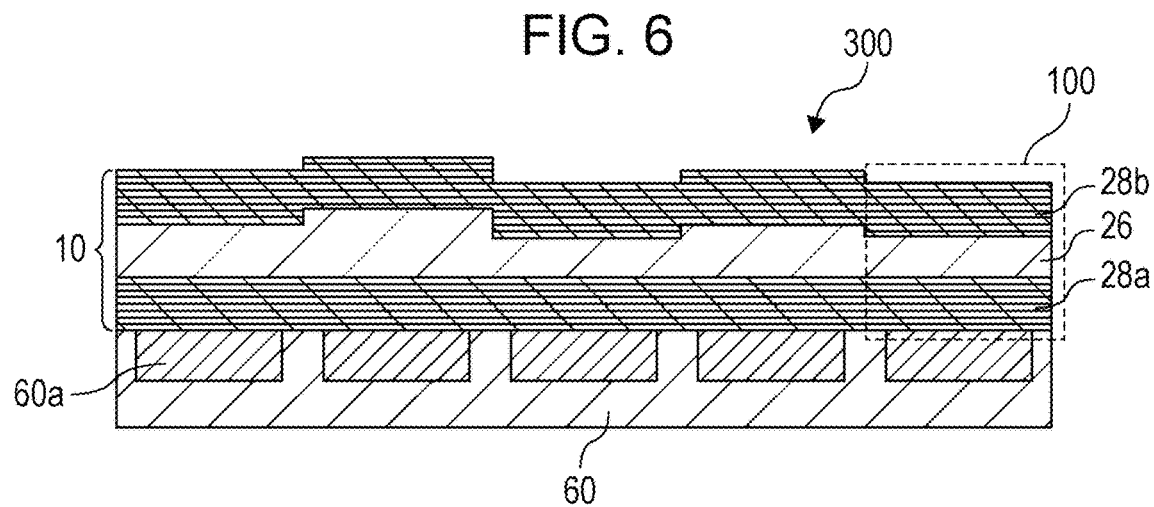
FIG. 6 schematically illustrates a part of a cross section of a photodetector according to an exemplary embodiment.

FIG. 6 schematically illustrates a part of a cross section of the photodetector 300 according to the present embodiment. The photodetector 300 includes the filter array 10 and the image sensor 60. The filter array 10 includes filters 100 that are arranged two-dimensionally. The filters 100 are arranged in rows and columns. FIG. 6 schematically illustrates the sectional structure of one row. Each of the filters 100 includes a resonance structure. The resonance structure illustrated in FIG. 6 includes a first reflection layer 28a, a second reflection layer 28b, and an intermediate layer 26 between the first reflection layer 28a and the second reflection layer 28b. Each of the first reflection layer 28a and the second reflection layer 28b may be formed from a dielectric multilayer film or a metal thin film. The intermediate layer 26 may be formed from a dielectric or a semiconductor that is transparent in a specific wavelength region. The intermediate layer 26 may be formed from, for example, at least one selected from the group consisting of Si, $Si_3N_4$, $TiO_2$, $Nb_2O_5$, and $Ta_2O_5$. At least one of the refractive index or the thickness of the intermediate layer 26 of the filters 100 differs between the filters. The transmission spectrum of each of the filters 100 in the example illustrated in FIG. 6 has a maximal value of transmittance at each of wavelengths. The wavelengths respectively correspond to resonance modes of different orders in the resonance structure. In the present embodiment, all filters 100 in the filter array 10 have the resonance structure. As long as the filter array 10 includes at least one FP filter, the filter array 10 may include a filter that is not an FP filter. For example, the filter array 10 may include a filter whose light transmittance does not have wavelength dependency, such as a transparent filter or a natural density filter (ND filter).

The image sensor 60 includes photodetection elements 60a. Each of the photodetection elements 60a may be disposed, for example, at a position that receives transmitted light that has passed through at least one of the filters 100. Each photodetection element 60a detects light having wavelengths at which the transmission spectrum of each filter 100 has a maximal value. In the example illustrated in FIG. 6, each of the photodetection elements 60a is disposed to face a corresponding one of the filters.

Each of the photodetection elements 60a has a sensitivity to light in a specific wavelength region. The specific wavelength region corresponds to the target wavelength region W described above. In the present disclosure, the clause "has sensitivity to light in a certain wavelength region" means to have a substantial sensitivity necessary to detect light in the wavelength region. For example, this means that external quantum efficiency in the wavelength region is greater than or equal to 1%. The external quantum efficiency of the photodetection element 60a may be greater than or equal to 10%. The external quantum efficiency of the photodetection element 60a may be greater than or equal to 20%. The wavelengths at which the light transmittance of each filter 100 has a maximal value are all included in the target wavelength region W. That is, the photodetector 300 according to the present embodiment can simultaneously detect light, having the wavelengths, that has passed through at least one of the filters and that differs between the photodetection elements 60a.

Next, a configuration example in a case where each of the first reflection layer 28a and the second reflection layer 28b is formed from a dielectric multilayer film will be described.

Figure 7:
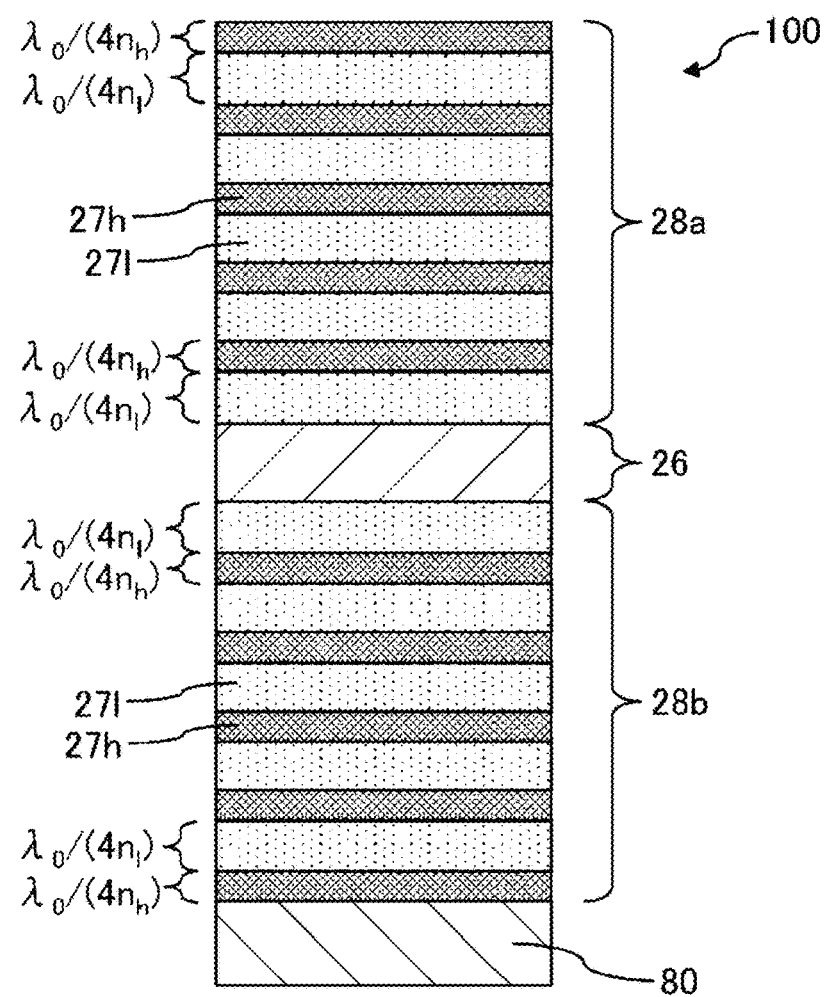
FIG. 7 schematically illustrates an example of a Fabry-Pérot filter.

FIG. 7 schematically illustrates an example of the filter 100 in which each reflection layer is formed from a dielectric multilayer film. The filter 100 is provided on a substrate 80. Each of the first reflection layer 28a and the second reflection layer 28b is formed from a dielectric multilayer film. That is, each of the first reflection layer 28a and the second reflection layer 28b has a structure such that low-refractive-index layers 27l and high-refractive-index layers 27h are alternately positioned. Each of the low-refractive-index layers 27l has a refractive index $n_l$, and each of the high-refractive-index layers 27h has a refractive index $n_h$ higher than the refractive index $n_l$. The low-refractive-index layers 27l of the first reflection layer 28a and the low-refractive-index layers 27l of the second reflection layer 28b may have the same refractive index or may have different refractive indices. The high-refractive-index layers 27h of the first reflection layer 28a and the high-refractive-index layers 27h of the second reflection layer 28b may have the same refractive index or may have different refractive indices.

The dielectric multilayer film includes pair layers. Each of the pair layers includes one low-refractive-index layer 27l and one high-refractive-index layer 27h. In the example illustrated in FIG. 7, each of the first reflection layer 28a and the second reflection layer 28b includes four pair layers including eight refractive index layers. In the example illustrated in FIG. 7, in order to obtain high reflectance at a specific wavelength $\lambda_0$ in the target wavelength region W, the thickness of the high-refractive-index layer 27h is set to $t_h = \lambda_0/(4n_h)$, and the thickness of the low-refractive-index layers 27l is set to $t_l = \lambda_0/(4n_l)$. In other words, the optical length of the thickness $t_h$ of the high-refractive-index layer 27h and the optical length of the thickness $t_l$ of the low-refractive-index layer 27l are each $\lambda_0/4$. Here, optical length means the product of thickness and refractive index. The specific wavelength $\lambda_0$ may be set, for example, to the center wavelength $(\lambda_i + \lambda_e)/2$ of the target wavelength region W.

Example of Configuration of Filter Array for Reducing Reconstruction Errors

Next, an example of the configuration of the filter array 10 for reducing reconstruction errors will be described.

First, an effect in a case where the filter array 10, which is composed of FP filters, is used in a hyperspectral camera that performs reconstruction processing by compressed sensing will be described. According to the argument described above, by appropriately designing each reflection layer and each intermediate layer of the FP filters, it is possible to design the filter array 10 so that the mean transmittance for each wavelength band is uniform and the standard deviation of transmittances is greater than or equal to a certain value. As a result, it seems possible to improve the convergence of the solution in the ill-posed problem of compressed sensing and to reduce errors associated with reconstruction of images of multiple wavelength bands.

However, in general, the sensitivity of the image sensor 60 has wavelength dependency. In a hyperspectral camera using compressed sensing, the image sensor 60 detects light that has passed through the filter array 10, and the multiwavelength separated images 220 are reconstructed based on a signal of pixel values output from the image sensor 60. Accordingly, in reconstruction of the multiwavelength separated images 220, it is necessary to take into consideration the sensitivity characteristics of the image sensor 60 in addition to the transmission characteristics of the filter array 10.

Thus, when the wavelength dependency of the sensitivity of the image sensor is taken into consideration, in order to reduce reconstruction errors, it is required, not to make the mean value of the transmittances of the filter array 10 uniform in all bands, but to make the mean value of pixel values for each band output from the image sensor uniform in all bands. Likewise, it is required, not to make the standard deviation of the transmittances of the filter array 10 greater than or equal to a certain value in all bands, but to make the standard deviation of pixel values for each band output from the image sensor greater than or equal to a certain value in all bands.

In the present specification, a pixel value about a certain band may mean a signal value that is output when only light corresponding to the band is detected via the filter array 10. Examples of a method for causing the photodetector 300 to detect only light corresponding to a certain band include a method using a wavelength tunable laser and an integrating sphere. To be specific, light emitted by the wavelength tunable laser and corresponding to a certain wavelength band is caused enter an integrating sphere, and the photodetector 300 is caused to detect light that is spatially uniformized by the integrating sphere. When the photodetector 300 is to be caused to detect only light corresponding to a certain wavelength band, light having a wavelength that is deviated by several nanometers from a wavelength region corresponding to the wavelength band may be caused to enter the photodetector 300. That is, light having a wavelength that is several nanometers smaller than the lower limit of the wavelength region corresponding to a certain wavelength band or light having a wavelength that is several nanometers larger than the upper limit of the wavelength region corresponding to the certain wavelength band may be caused to enter the photodetector 300.

Figure 8A:
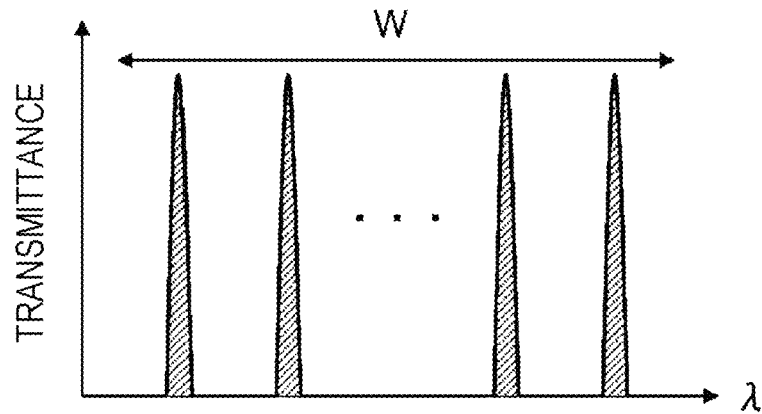
FIG. 8A schematically illustrates the transmission spectrum of a filter array included in the photodetector illustrated in FIG. 6.
Figure 8B:
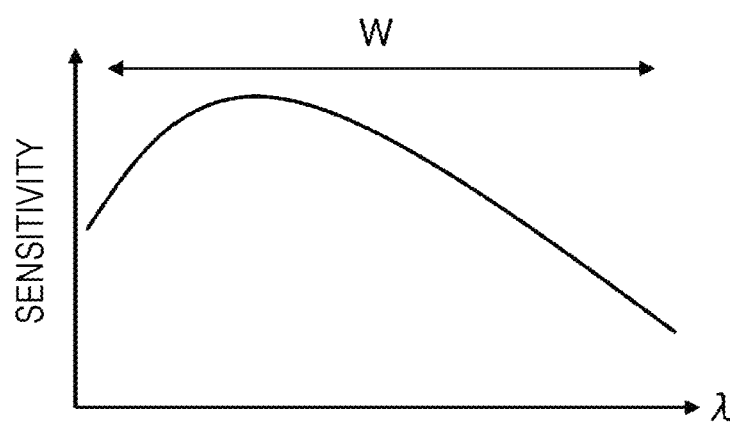
FIG. 8B schematically illustrates the sensitivity spectrum of an image sensor included in the photodetector illustrated in FIG. 6.
Figure 8C:
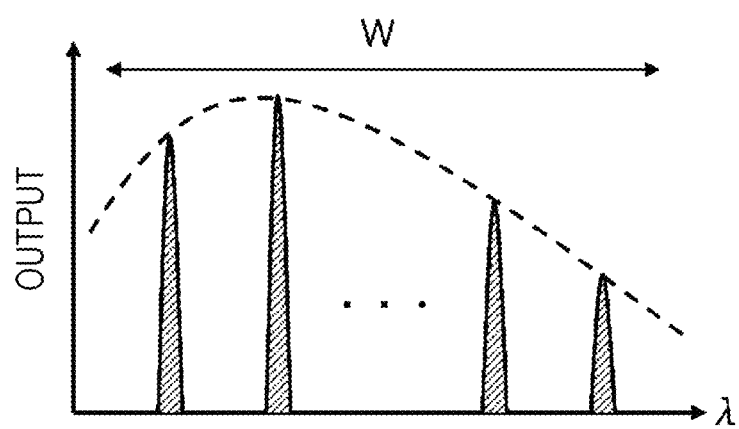
FIG. 8C schematically illustrates the output spectrum of the photodetector illustrated in FIG. 6.

Next, referring to FIGS. 8A to 8C, the wavelength dependency of a signal that is output from the photodetector 300 illustrated in FIG. 6 will be described. FIG. 8A schematically illustrates the transmission spectrum of the filter array 10 included in the photodetector 300 illustrated in FIG. 6. FIG. 8B schematically illustrates the sensitivity spectrum of the image sensor 60 included in the photodetector 300 illustrated in FIG. 6. FIG. 8C schematically illustrates an output spectrum of the photodetector 300 illustrated in FIG. 6. The output signal of the photodetector 300 includes information of a pixel value.

As illustrated in FIG. 8A, the transmission spectrum the filter array 10 has maximal values of transmittance in the target wavelength region W. As illustrated in FIG. 8B, the sensitivity of the image sensor 60 has the maximum value at a certain wavelength in the target wavelength region W and decreases on the long-wavelength side and the short-wavelength side of the target wavelength region W. For example, silicon sensors used for detection of light in the visible region have the highest sensitivity at a wavelength around 500 nm and have lower sensitivities on the shorter-wavelength side and the longer-wavelength side of the visible region. The sensitivity of any sensor, not only silicon sensors, has some wavelength dependency in sensitivity due to the photoelectric conversion material and/or the sensor structure thereof. As illustrated in FIG. 8C, the output spectrum of the photodetector 300 has a shape different from that of the transmission spectrum of the filter array 10 to a degree such that the transmission spectrum is multiplied by the sensitivity spectrum of the image sensor 60 illustrated in FIG. 8B. The broken line in FIG. 8C represents the sensitivity spectrum illustrated in FIG. 8B.

Suppose a case where a filter array 10 having an ideal transmittance distribution that is spatially and wavelength-wise random can be produced due to improvement in design and technology for producing FP filters. Even in such a case, because the sensitivity of the image sensor 60 has wavelength dependency, with the photodetector 300 in which the filter array 10 and the image sensor 60 are integrally formed, a pixel value distribution obtained from an output signal may not be spatially and wavelength-wise random. It is conceivable to design the filter array 10 in consideration of the sensitivity spectrum of the image sensor 60 in order to obtain an ideal pixel value distribution that is spatially and wavelength-wise random. However, such a design of the filter array 10 is not effective when the sensitivity spectrum of the image sensor 60 changes over the years.

Figure 9:
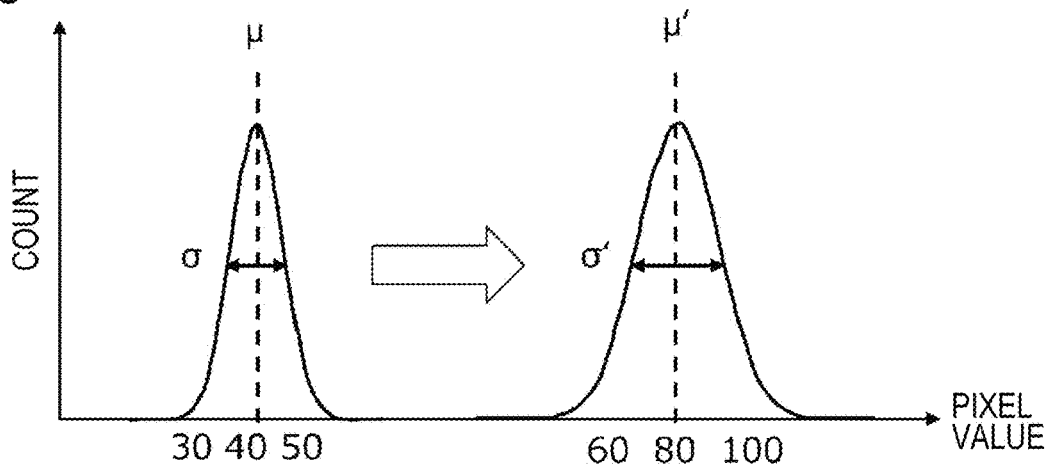
FIG. 9 schematically illustrates histograms of pixel values about a certain band in a case where the wavelength dependency of the sensitivity of an image sensor is taken into consideration and in a case where the wavelength dependency is not taken into consideration.

Here, consider performing sensor output in such a way as to cancel the wavelength dependency of the sensitivity of an image sensor by performing appropriate signal processing on a signal that is output from that image sensor. That is, consider uniformizing, in all bands, the mean value of pixel values for each band by performing gain adjustment on pixel values about a certain wavelength band included in a wavelength region in which the sensitivity of image sensor is low. Let denote the mean value of pixel values before gain adjustment is performed, and let $\mu$ denote the mean value of pixel values after gain adjustment has been performed. Likewise, let $\mu'$ denote the standard deviation of pixel values before gain adjustment is performed, and let $\sigma'$ denote the standard deviation of pixel values before gain adjustment has been performed. FIG. 9 schematically illustrates histograms of pixel values before and after gain adjustment is performed, regarding a certain band. Assume that, regarding a certain wavelength band, for example, gain adjustment is performed so that the mean value of pixel values changes from $\mu=40$ to $\mu'=80$ as illustrated in FIG. 9. In this case, the standard deviation of pixel values changes from $\sigma=50-30=20$ to $\sigma'=100-60=40$, and it can be seen that the standard deviation of pixel values changes together with the mean value.

Although it is possible to set the mean value of pixel values output from the image sensor uniform by gain adjustment or the like, the standard deviation of pixel values does not necessarily have a value such that reconstruction errors can be reduced in all bands as a result of the gain adjustment. Thus, the inventors have found that it is necessary to design the filter array 10 in consideration of the wavelength dependency of the sensitivity of the image sensor and gain adjustment for cancelling the wavelength dependency of the sensitivity of the image sensor. The inventors have conceived that it is possible to reduce errors between a correct image and a reconstructed image for each band irrespective of the wavelength dependency of the sensitivity of the image sensor 60 by using the filter array 10 such that $\sigma/\mu$, which the quotient of the standard deviation a of transmittances divided by the mean transmittance $\mu$, is greater than or equal to a certain value regarding all bands.

As described above, by performing gain adjustment on pixel values for each band, it is possible to uniformize the mean value of pixel values in all bands. $\sigma/\mu$ may be a physical quantity that is obtained by normalizing the standard deviation a with the mean value $\mu$. That is, the fact that $\sigma/\mu$ is greater than or equal to a certain value may mean that the standard deviation of pixel values about all bands is greater than or equal to a certain value when the mean value of pixel values of all bands is uniformized.

$\sigma/\mu$ does not depend on the wavelength dependency of the sensitivity of the image sensor and signal processing such as gain adjustment. That is, in a certain band, $\sigma1/\mu1=\sigma2/\mu2$ holds, where $\sigma1/\mu1$ is the standard deviation of transmittances divided by the mean transmittance the filter array 10, and $\sigma2/\mu2$ is the standard deviation of transmittances divided by the mean value of pixel values output by the image sensor. Moreover, as described above with reference to FIG. 9, the index $\sigma/\mu$ does not change even when the pixel values of all pixels are multiplied by a constant for each band.

In general, the standard deviation of pixel values output by the image sensor can be defined, and by designing the filter array 10 by using $\sigma/\mu$, which does not depend on the wavelength dependency of the sensitivity of the image sensor and signal processing such as gain adjustment, as an index, it becomes possible to reduce reconstruction errors.

Figure 10:
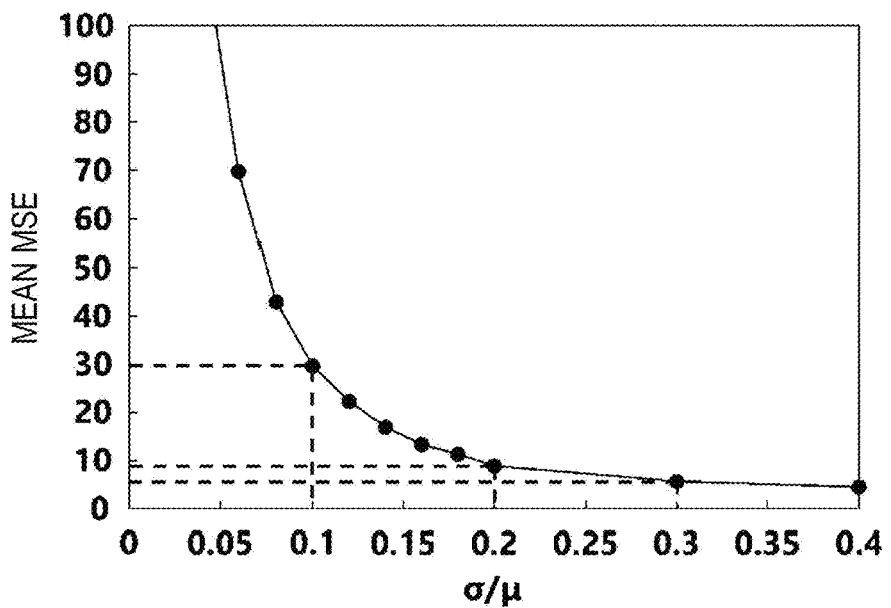
FIG. 10 is a graph illustrating the relationship between σ/μ about all bands and the mean value of MSE of all bands.

Next, referring to FIG. 10, how the reconstruction characteristics depend on $\sigma/\mu$ about all bands will be described.

In the following example, the mean square error (MSE) is used as an error. MSE is calculated by using the following equation (5).

$$MSE = \frac{1}{n \cdot m} \sum_{i=1}^{n} \sum_{j=1}^{m} (I'_{i,j} - I_{i,j})^2 \qquad (5)$$

Here, n and m respectively denote pixel numbers in the vertical direction and the horizontal direction. $I_{i,j}$ denotes a pixel value of a correct image in a pixel at a position (i, j). $I'_{i,j}$ denotes a pixel value of a reconstructed image in each band in a pixel at a position (i, j). FIG. 10 is a graph illustrating the relationship between σ/μ about all bands and the mean value of MSE of all bands. In the example illustrated in FIG. 10, the mean value and the standard deviation of pixel values in all bands are uniform. As illustrated in FIG. 10, the mean value of MSE of all bands decreases exponentially as σ/μ about all bands increases. When σ/μ about all bands is greater than or equal to 0.1, the mean value of MSE of all bands is less than 30. When σ/μ about all bands is greater than or equal to 0.2, the mean value of MSE of all bands is less than 10. When σ/μ about all bands is greater than or equal to 0.3, the mean value of MSE of all bands is less than 6. In the present embodiment, among the N bands, the $\sigma_i/\mu_i$ of any i-th band may be set, for example, to be greater than equal to 0.1, greater than or equal to 0.2, or greater than or equal to 0.3.

The filter array 10 that satisfies such a condition can be realized by appropriately designing the filter 100 included in the filter array 10. To be specific, in the filter 100 illustrated in FIG. 7, the followings are appropriately designed: the number, the refractive indices, and the thicknesses of the high-refractive-index layers 27h and the low-refractive-index layers 27l included in each of the first reflection layer 28a and the second reflection layer 28b; and the refractive index and the thickness of the intermediate layer 26. It is possible to integrally form the filter array 10 on the image sensor 60 through a known semiconductor process.

Figure 11:
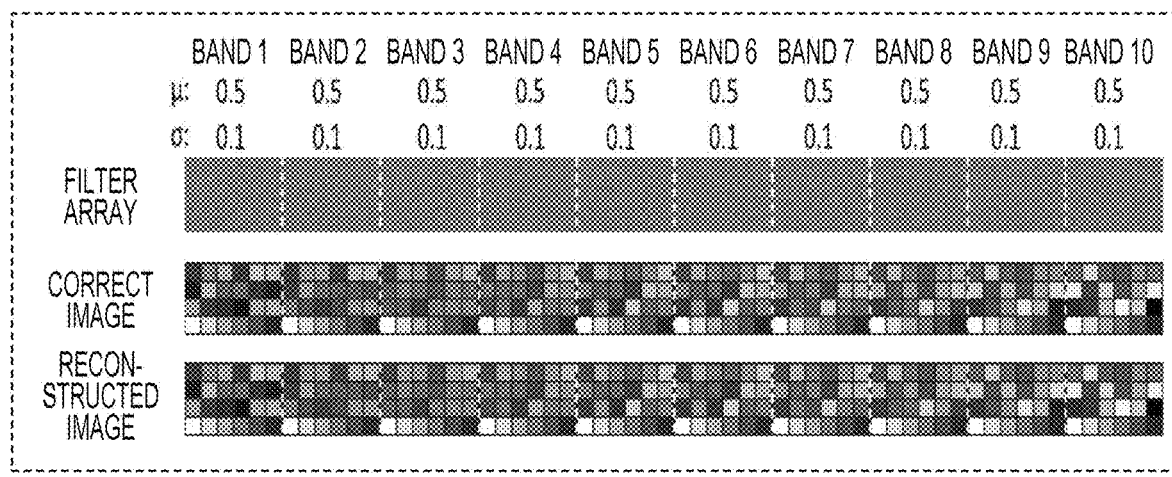
FIG. 11 is a view for illustrating reconstruction characteristics in a case where an ideal filter array whose transmission characteristics are approximately at the same level for any wavelength bands is used.

FIG. 11 is a view for illustrating reconstruction characteristics in a case where the filter array 10 whose σ/μ in each wavelength band is 0.2 is used. In the example illustrated in FIG. 11, ten bands 1 to 10 are assumed. The transmittance distribution of each band is given by random numbers in the range from 0.0 to 1.0 and having a normal distribution of a mean transmittance of 0.5 and a standard deviation of 0.1. In this example, a color chart including 24 color samples arranged in a matrix pattern is an object to be imaged. The lowest part of FIG. 11 illustrates examples of images for the bands reconstructed by performing compressed sensing described above on an image captured by a hyperspectral camera. The middle part of FIG. 11 illustrates correct images. In this example, the filter array 10 is a 640×480 two-dimensional filter array. The image sensor 60 represents a pixel value with 8-bit gradations (that is, 0 to 255).

In this example, σ/μ>0.1 is satisfied in the ten bands 1 to 10, and therefore MSE is controlled to be low in any of the bands and the mean value of MSE of all bands is 8.88. This value is approximately 3 when converted into a pixel value of the image sensor 60, and corresponds to an error of approximately 1% of the maximum value 255 of the pixel value. In this way, when σ/μ of the transmittance of the filter array 10 for each band exceeds 0.1, an image of each band can be reconstructed with high accuracy.

In the filter array 10 according to the present embodiment, regarding the transmittance distribution, as long as the mean value and the standard deviation a of transmittances in all bands satisfy σ/μ≥0.1, the mean value of transmittances need not be uniform in all bands. Likewise, in the photodetector 300 according to the present embodiment, regarding the pixel value distribution, as long as the mean value and the standard deviation a of pixel values in all bands satisfy σ/μ≥0.1, the mean value of pixel values need not be uniform in all bands. Even if the mean value of transmittances or the mean value of pixel values is not uniform in all bands, the signal processing circuit 200 can perform correction by signal processing so that the mean value of pixel values becomes uniform in all bands by multiplying the mean value by a constant. Before and after the correction, σ/μ in all bands does not change, and σ/μ≥0.1 is satisfied. Accordingly, with the present embodiment, it is possible to reduce errors associated with reconstruction of images of multiple wavelength bands.

The optical properties of the filter array 10 in the above argument, that is, the mean transmittance and the standard deviation of transmittances about each wavelength band can be clarified by measuring and analyzing a histogram in any region including about 8 vertical pixels×8 horizontal pixels. If it is technically difficult to measure the transmission spectrum of the filter array 10, it is possible to measure and analyze a histogram in the same way by measuring a reflection spectrum about each wavelength band. If the filter array 10 is integrated on the image sensor 60, it is also possible to measure and analyze a histogram including the sensitivity characteristics of the image sensor 60 itself. Moreover, when each filter of the filter array 10 is an FP filter, in general, there is a correlation between a histogram and the thickness of the filter, which is composed of a first reflection layer, a second reflection layer, and an intermediate layer disposed between the first reflection layer and the second reflection layer. From this, it is also possible to acquire similar information by measuring distribution of thickness in any region including about 8 vertical pixels×8 horizontal pixels.

In the embodiment, the filter array 10 in which filters are arranged two-dimensionally has been mainly described. However, the filters may be arranged one-dimensionally. In this case, a one-dimensional image sensor may be used as a photodetector. Such a configuration may be used when an object to be measured is a one-dimensional region.

The following cases are also included in the present disclosure.

A coding element different from a filter array may be used in a photodetector. For example, the photodetector 300 may be configured to detect light that has passed through an optical element such as a meta lens. Such an optical element may be incorporated in at least a part of the optical system 40. Alternatively, the photodetector 300 may include an optical element instead of the filter array 10. The optical element changes incident light, which is incident on a light-incident surface of the optical element, spatially and wavelength-wise, and emits the light from a light-emission surface of the optical element. The image sensor 60 detects the light emitted from the light-emission surface of the optical element.

That is, a photodetector to be used in a photodetection system that generates image data of each of N wavelength bands (where N is an integer greater than or equal to 4) may be configured as follows. The photodetector includes: a coding element whose light transmittance in each of the N wavelength bands differs between positions; and an image sensor that detects light that has passed through the coding element. The image sensor detects only light corresponding to an i-th wavelength band (where i is an integer greater than or equal to 1 and less than or equal to N) among the N wavelength bands, and thereby outputs data that represents a pixel value distribution corresponding to the i-th wavelength band. $(\sigma 1/\mu 1) \geq 0.1, \ldots$, and $(\sigma N/\mu N) \geq 0.1$, where $\mu_i$ is a mean value of pixel values of the pixel value distribution corresponding the i-th wavelength band, and where $\sigma_i$ is a standard deviation of the pixel values of the pixel value distribution corresponding the i-th wavelength band.

The technology of the present disclosure can be used, for example, for a camera and a measurement apparatus each of which acquires a multiwavelength image. The technology of the present disclosure is also applicable to, for example: sensing for a living body, medical care, and beauty care; a system for detecting foreign substances and agrochemical residues in food; a remote sensing system; and an on-vehicle sensing system.

What is claimed is:

1. A filter array utilized in a photodetection system that generates image data of each of N wavelength bands, where N is an integer greater than or equal to 4, the filter array comprising:

optical filters whose light transmittances in each of the N wavelength bands differ from each other, wherein $(\sigma_1/\mu_1) \geq 0.1, \ldots$, and $(\sigma_N/\mu_N) \geq 0.1$, where $\mu_i$ is a mean value of transmittances of the optical filters with respect to light of an i-th wavelength band, where i is an integer greater than or equal to 1 and less than or equal to N, among the N wavelength bands, the transmittances of the optical filters with respect to light of the i-th wavelength band corresponding one-to-one to the optical filters, wherein the mean value μi of the transmittances is represented by $$\mu_i = \frac{1}{M} \sum_{j=1}^{M} T_{ij},$$

and wherein $T_{ij}$ denotes a transmittance of a j-th filter among M optical filters with respect to light of the i-th wavelength band among the N wavelength bands, and where $\sigma_i$ is a standard deviation of the transmittances.

2. The filter array according to claim 1,
   wherein at least one of the optical filters is a Fabry-Pérot filter.

3. The filter array according to claim 1,
   wherein at least one of the optical filters includes a first reflection layer, a second reflection layer, and an intermediate layer between the first reflection layer and the second reflection layer, and includes a resonance structure having resonance modes whose orders differ from each other.

4. A photodetector utilized in a photodetection system that generates image data of each of N wavelength bands, where N is an integer greater than or equal to 4, the photodetector comprising:

optical filters whose light transmittances in each of the N wavelength bands differ from each other; and an image sensor that detects light that has passed through the optical filters, wherein the image sensor detects only light corresponding to an i-th wavelength band, where i is an integer greater than or equal to 1 and less than or equal to N, among the N wavelength bands, and thereby outputs data that represents a pixel value distribution corresponding to the i-th wavelength band, and wherein $(\sigma_1/\mu_1) \geq 0.1, \ldots$, and $(\sigma_N/\mu_N) \geq 0.1$, where $\mu_i$ is a mean value of pixel values of the pixel value distribution corresponding the i-th wavelength band, and where $\sigma_i$ is a standard deviation of the pixel values of the pixel value distribution corresponding the i-th wavelength band.

5. The photodetector according to claim 4,
   wherein at least one of the optical filters is a Fabry-Pérot filter.

6. The photodetector according to claim 4,
   wherein at least one of the optical filters includes a first reflection layer, a second reflection layer, and an intermediate layer between the first reflection layer and the second reflection layer, and includes a resonance structure having resonance modes whose orders differ from each other.

7. The photodetector according to claim 4,
   wherein a transmission spectrum of each of the optical filters has a maximal value of transmittance at each of wavelengths included in a target wavelength range, wherein the image sensor includes photodetection elements, and wherein each of the photodetection elements is disposed at a position that receives transmitted light that has passed through at least one of the optical filters, and detects light having the wavelengths included in the transmitted light.

8. A photodetection system comprising:
   the photodetector according to claim 4; and
   a signal processing circuit that generates the image data about each of the N wavelength bands based on a signal that is output from the image sensor.

9. The photodetection system according to claim 8,
   wherein the signal processing circuit generates the image data by performing an operation that uses compressed sensing.

10. The photodetector according to claim 4, wherein the data includes the pixel values corresponding to pixels included in the image sensor.

11. A photodetector utilized in a photodetection system that generates image data of each of N wavelength bands, where N is an integer greater than or equal to 4, the photodetector comprising:

a coding element whose light transmittance in each of the N wavelength bands differs between positions; and an image sensor that detects light that has passed through the coding element, wherein the image sensor detects only light corresponding to an i-th wavelength band, where i is an integer greater than or equal to 1 and less than or equal to N, among the N wavelength bands, and thereby outputs data that represents a pixel value distribution corresponding to the i-th wavelength band, and wherein $(\sigma_1/\mu_1) \geq 0.1, \ldots$, and $(\sigma_N/\mu_N) \geq 0.1$, where $\mu_i$ is a mean value of pixel values of the pixel value distribution corresponding the i-th wavelength band, and where $\sigma_i$ is a standard deviation of the pixel values of the pixel value distribution corresponding the i-th wavelength band.

12. The photodetector according to claim 11, wherein the data includes the pixel values corresponding to pixels included in the image sensor.

* * * * *